(12) United States Patent
Ravi et al.

(10) Patent No.: US 7,329,588 B2
(45) Date of Patent: Feb. 12, 2008

(54) FORMING A RETICLE FOR EXTREME ULTRAVIOLET RADIATION AND STRUCTURES FORMED THEREBY

(75) Inventors: Kramadhati V. Ravi, Atherton, CA (US); Bryan J. Rice, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 263 days.

(21) Appl. No.: 10/991,246

(22) Filed: Nov. 16, 2004

(65) Prior Publication Data

US 2006/0102986 A1    May 18, 2006

(51) Int. Cl.
*H01L 21/302*    (2006.01)
(52) U.S. Cl. ............... 438/458; 438/459; 257/E21.036
(58) Field of Classification Search .............. 438/456; 257/E21.036
See application file for complete search history.

(56) References Cited

U.S. PATENT DOCUMENTS

| | | | | |
|---|---|---|---|---|
| 6,355,381 | B1* | 3/2002 | Yan et al. | 430/5 |
| 6,835,508 | B2* | 12/2004 | Butschke et al. | 430/5 |
| 7,041,577 | B2* | 5/2006 | Rayssac et al. | 438/458 |
| 2004/0209174 | A1* | 10/2004 | Moriya et al. | 430/5 |
| 2006/0124581 | A1* | 6/2006 | Morimoto | 216/12 |

* cited by examiner

*Primary Examiner*—Stephen W. Smoot
(74) *Attorney, Agent, or Firm*—Kathy Ortiz; Intel Corporation

(57) ABSTRACT

Methods of forming a microelectronic structure are described. Embodiments of those methods include forming a plurality of openings in a portion of a first side of a substrate, bonding a first silicon layer of a silicon on insulator wafer to the first side of the substrate, wherein the silicon on insulator wafer comprises the first silicon layer disposed on an insulator layer disposed on a second silicon layer, forming a plurality of support structures by removing a portion of a second side of the substrate, removing the second silicon layer and removing the insulator layer.

10 Claims, 10 Drawing Sheets

FORMING A RETICLE FOR EXTREME ULTRAVIOLET RADIATION AND STRUCTURES FORMED THEREBY

BACKGROUND OF THE INVENTION

During the manufacture of microelectronic devices, many layers may be fabricated on a substrate, and a reticle or photomask may be required for each layer that may be formed, or patterned on a substrate, such as a silicon wafer. A reticle protection structure, such as a pellicle, may be used to protect the reticle from contamination during processing.

As the dimensions of patterned layers on microelectronic devices have become increasingly small, radiation sources such as deep ultraviolet (248 nm or 193 nm), vacuum ultraviolet (157 nm) and extreme ultraviolet (EUV) (13.4 nm) have been are being used or are being considered. EUV lithography, which uses a source at 13.5 nm wavelength, is a promising technology for 0.03 micron and below microelectronic device fabrication, for example. Since the absorption at that wavelength is very strong in most materials, EUV lithography may employ reflective mask reticles, rather than through-the-mask reticles used in longer wavelength lithography. The EUV absorption may make it difficult to protect the reticle by utilizing a typical reticle protection structure.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
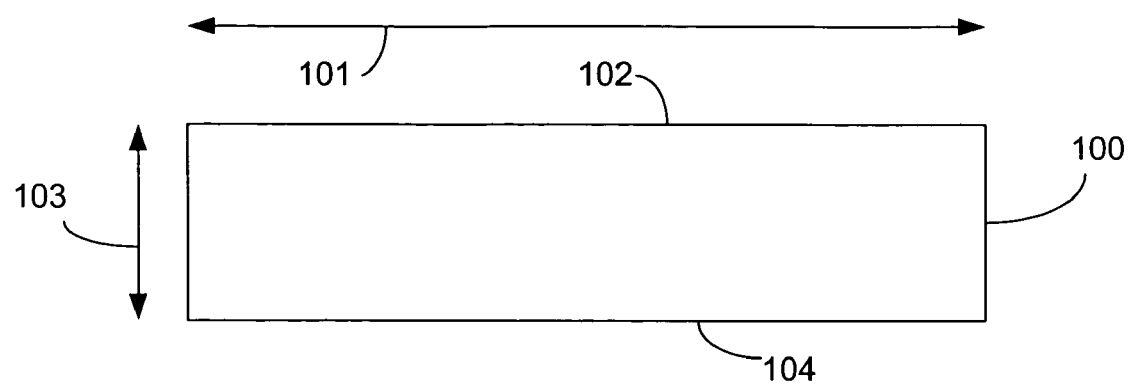
FIGS. 1a-1k and FIG. 1m represent methods of forming structures according to an embodiment of the present invention.
Figure 1B:
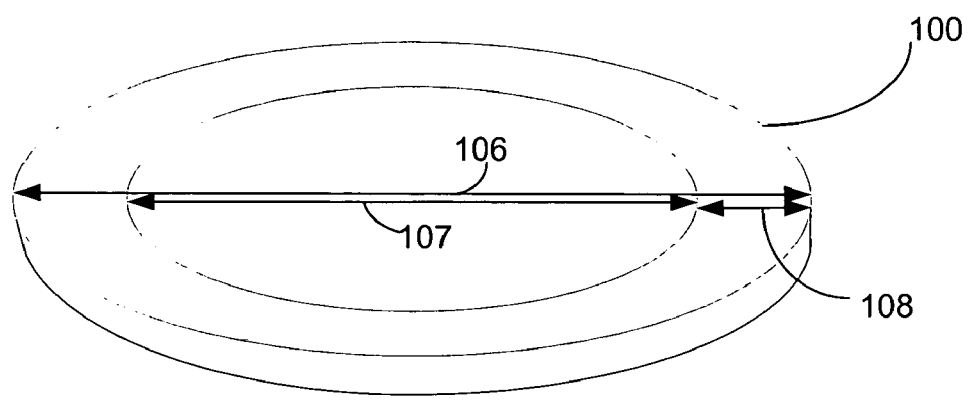

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a reticle protection structure, are described. Those methods may comprise forming a plurality of openings in a portion of a first side of a substrate, bonding a first silicon layer of a silicon on insulator wafer to the first side of the substrate, wherein the silicon on insulator wafer comprises the first silicon layer disposed on an insulator layer disposed on a second silicon layer, forming a plurality of support structures by removing a portion of a second side of the substrate, and then removing the second silicon layer and removing the insulator layer.

FIGS. 1a-1k illustrate an embodiment of a method of forming a microelectronic structure, such as a reticle protection structure, for example. FIG. 1a is a cross-sectional side view that illustrates a substrate 100. In one embodiment, the substrate 100 may comprise silicon, silicon on oxide, and/or silicon dioxide, for example. The substrate 100 may comprise a first side 102, a second side 104, a length 101 and a height 103. In one embodiment, the height may comprise about 700 microns. In one embodiment the substrate 100 may comprise a silicon wafer, and may comprise an inner portion 107, an outer portion 108, and a diameter 106 (FIG. 1b, which is a perspective view of the substrate 100). In one embodiment the diameter 106 may comprise about 200 mm.

Figure 1C:
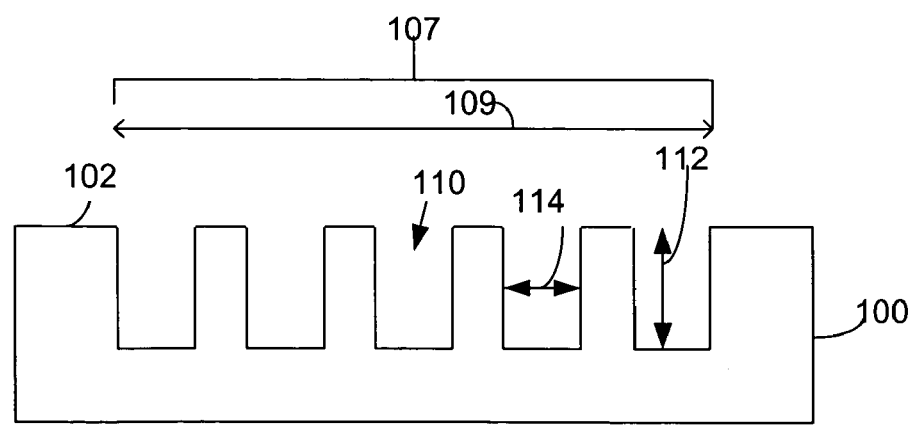

A plurality of openings 110 may be formed within the first side 102 of the substrate 100 (FIG. 1c). In one embodiment, the plurality of openings 110 may comprise a width 114 from about 30 to about 50 microns. In one embodiment, the plurality of openings 100 may be formed within an inner portion 107 of the substrate 100. In one embodiment, the inner portion 107 may comprise a length 109 and/or diameter that may be less than the length 101 and/or diameter of the substrate 100. In one embodiment, the length 109 of the inner portion 107 may comprise a length from about 5 to about 6 inches. In one embodiment, the length 109 of the inner portion 107 may comprise about 60 to about 80 percent of the length 101 of the substrate 100.

In one embodiment, the plurality of openings 110 may comprise a height 112, which may be less than the height 103 of the substrate 100. In one embodiment, the height 112 of the plurality of openings may be from about 200 to about 300 microns. The plurality of openings 110 may be formed by etching the substrate 100, such as by performing a reactive ion etch (RIE) as is well known in the art.

Figure 1D:
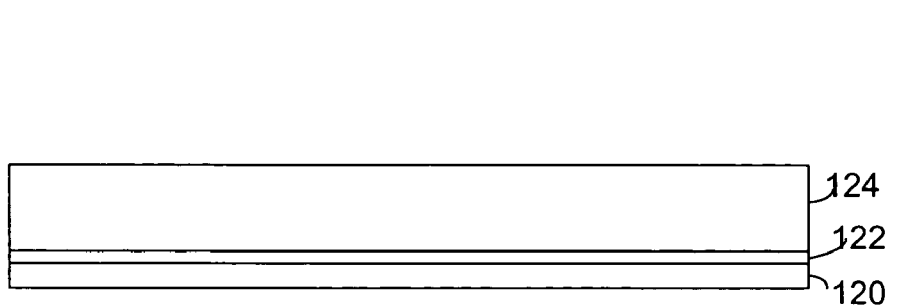

A silicon on insulator wafer 126, as is well known in the art, may be provided (FIG. 1d), wherein the silicon on insulator wafer 126 may comprise a first silicon layer 120 that may be disposed on an insulator layer 122, and the insulator layer 122 may be further disposed on a second silicon layer 124 (FIG. 1d). The first silicon layer 120 may comprise a thickness of under about 1,000 angstroms, and in one embodiment may comprise between about 500 and 1,000 angstroms. In one embodiment, since the first silicon layer 120 comprises a thickness of about 1,000 angstroms or less, the first silicon layer 120, unlike most other types of materials in the prior art, may transmit EUV radiation, i.e. radiation comprising a wavelength between about 12 to about 14 nm, as is well known in the art. In one embodiment, the first silicon layer 120 may transmit at least about 60 percent of EUV radiation that may be directed towards the first silicon layer 120 (for example during a photolithography process), and in another embodiment, the first silicon layer 120 may transmit above about 70 percent of EUV radiation.

The insulator layer 122 may comprise any type of insulator as is known in the art, and in one embodiment may comprise an oxide, such as a silicon oxide, and/or a nitride, such as a silicon nitride. The first silicon layer 120 of the silicon on insulator wafer 126 may be bonded to the substrate 100 (FIG. 1e). In one embodiment, the first silicon layer 120 may be bonded to the substrate 100 by placing the first silicon layer 120 in direct contact with the first side of the substrate 100 and heating at a temperature above about 600 degrees Celsius, for about 2 hours.

Figure 1M:
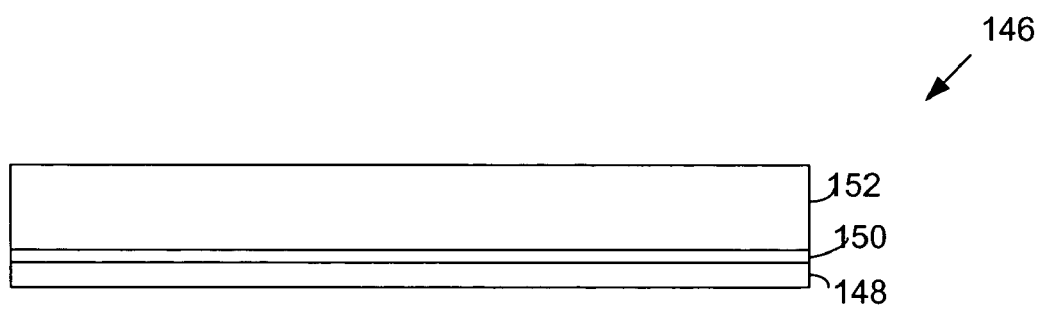
Figure 1E:
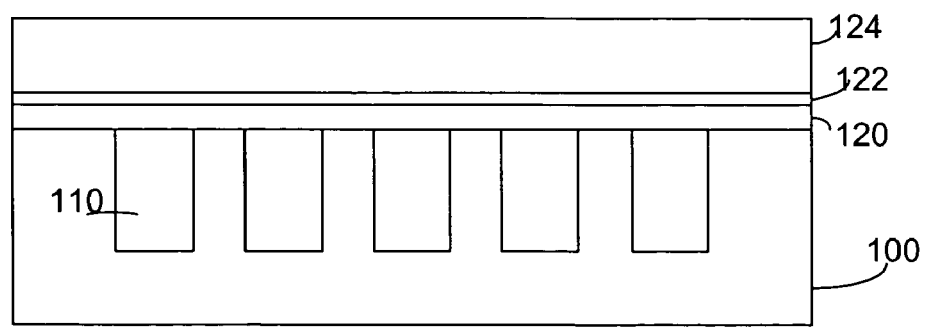

In another embodiment, a EUV transmissive wafer on insulator 146 may be provided (FIG. 1m). The EUV transmissive wafer on insulator 146 may comprise a EUV transmissive layer 148 that may be disposed on an insulator layer 140, and the insulator layer 150 may be further disposed on a silicon layer 152 (FIG. 1m). The EUV transmissive layer 148 may comprise any type of material that may transmit above about 60 percent of EUV radiation. In one embodiment, the EUV transmissive layer 148 may comprise a thickness of less than about 1,000 angstroms. In one embodiment, the EUV transmissive layer 148 may be bonded to the substrate 100 by placing the EUV transmissive layer 148 in direct contact with the first side of the substrate 100 and heating at a temperature above about 600 degrees Celsius, for about 2 hours.

Figure 1F:
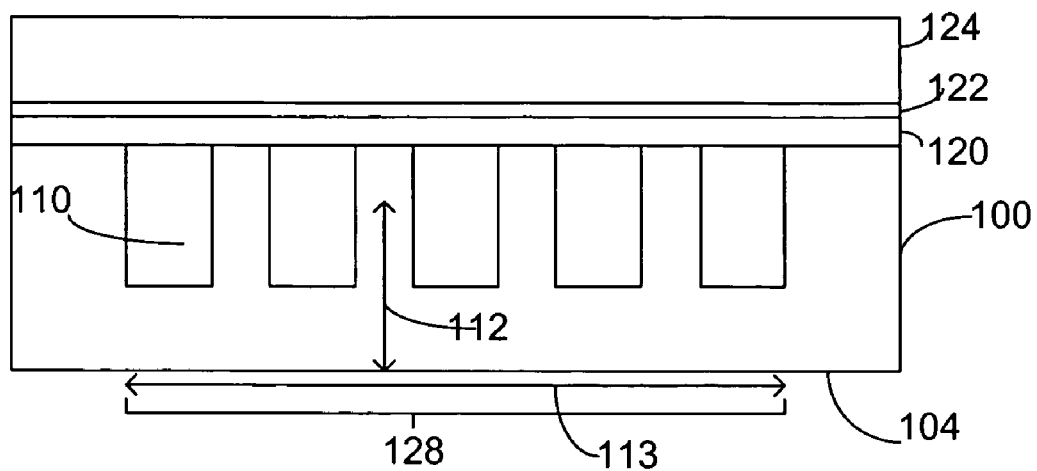
Figure 1F:
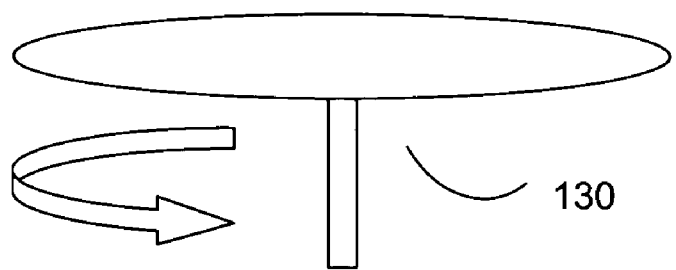

A portion 128 of the second side 104 of the substrate 100 may be removed (FIG. 1f). The portion 128 of the second side 104 of the substrate 100 may comprise a depth 112. In one embodiment, the portion 128 of the second side 104 of the substrate 100 may be removed by a grinding process, such as is well known in the art, by utilizing a grinding tool 130, for example. In one embodiment, the portion 128 of the second side 104 of the substrate 100 that may be removed may approximately comprise, or correspond in dimension and/or diameter 113 to the diameter 109 of the inner portion 107 of the first side 102 of the substrate 100 (see FIG. 1c). In one embodiment, the portion 128 that may be removed from the second side 104 of the substrate 100 may comprise a diameter 113 from about 5 to about 6 inches.

Figure 1G:
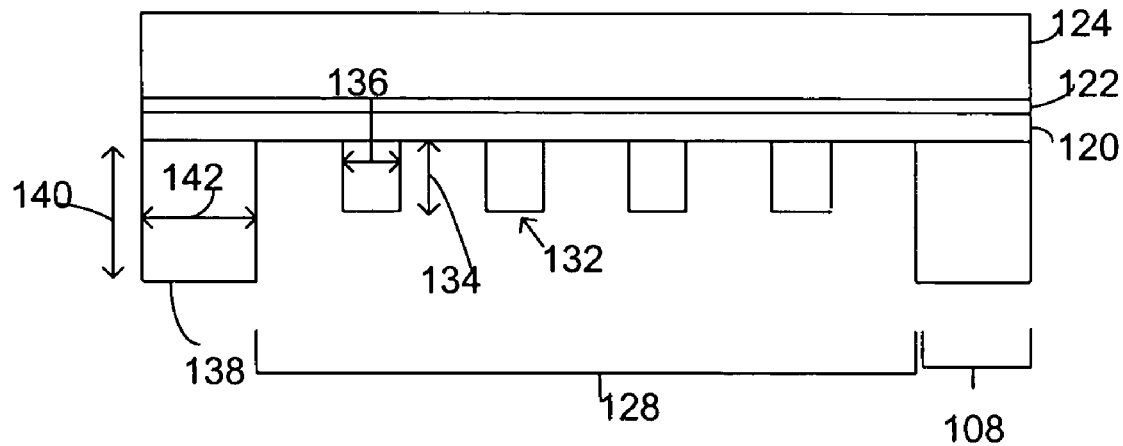
Figure 1H:
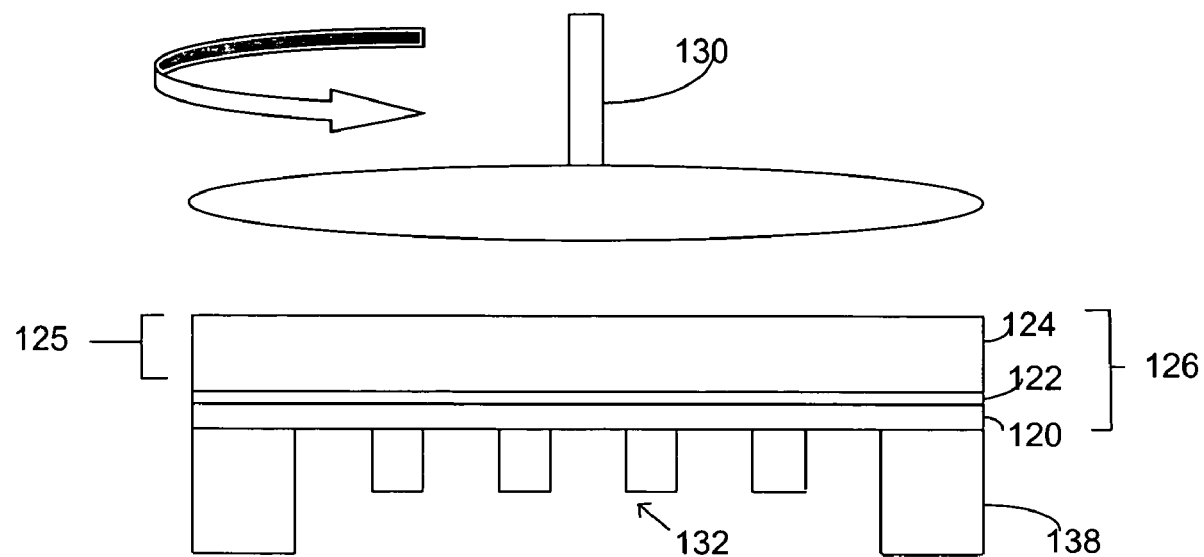

A plurality of support structures 132 may be formed by removing the portion 128 of the second side 104 of the substrate 102 (FIG. 1g). The plurality of support structures 132 may provide support for the first silicon layer 120. In one embodiment, the plurality of support structures 132 may comprise a height 134 and a width 136. In one embodiment, the height 134 may comprise from about 8 to about 10 microns. In one embodiment, the width 136 of the plurality of support structures 132 may comprise from about 23 to about 27 microns. A thick support structure 138 may be disposed within the outer portion 108 of the second side 104 of the substrate. In one embodiment, the thick support structure 138 may comprise a height 140 of about 200 to about 400 microns, and a width 142 of about 30 to about 50 microns.

Figure 1I:
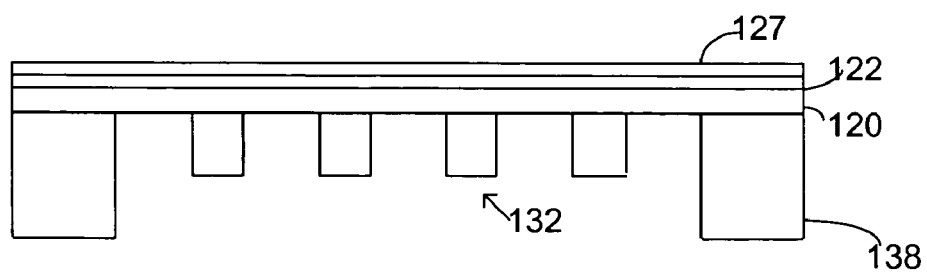
Figure 1J:
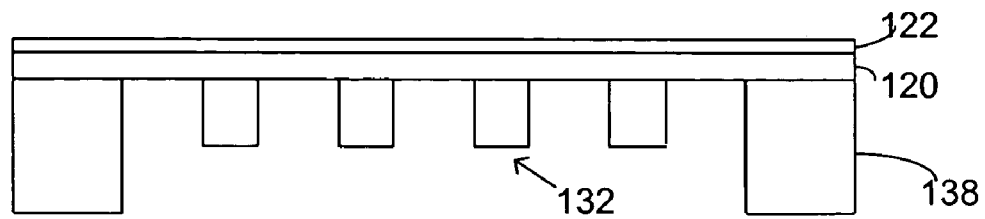

The second silicon layer 124 may be removed (FIG. 1h) from the silicon on insulator wafer 126. In one embodiment, a first portion 125 of the second silicon layer 124 may be removed with a grinding tool, for example by the grinding tool 130. A remaining portion 127 of the second silicon layer 124 may be removed by etching, such as by a wet etching or a plasma etching, as are known in the art (FIG. 1i). The insulator layer 122 may then be removed, for example by etching as is known in the art (FIG. 1j), to form a microelectronic structure 144 (FIG. 1k), wherein the microelectronic structure 144 may comprise the first silicon layer 120, the plurality of support structures 132, and the thick support structure 138.

The microelectronic structure 144 may comprise a reticle protection structure. The reticle protection structure 144 may comprise any structure that may serve to protect a reticle, as is known in the art, from particulate contamination, as well as providing protection from oxidation, for example. In one embodiment, the microelectronic structure 144 may comprise a pellicle. Because the first silicon layer 120 of the microelectronic structure 144 may comprise less than about 1,000 angstroms in some embodiments of the present invention, EUV radiation that may be reflected, (for example, during a subsequent photolithography process, as are well known in the art) through the first silicon layer 120 disposed on the plurality of openings 110, may substantially transmit EUV radiation. In one embodiment, the transmitted EUV radiation may be greater than about 70 percent.

Figure 2A:
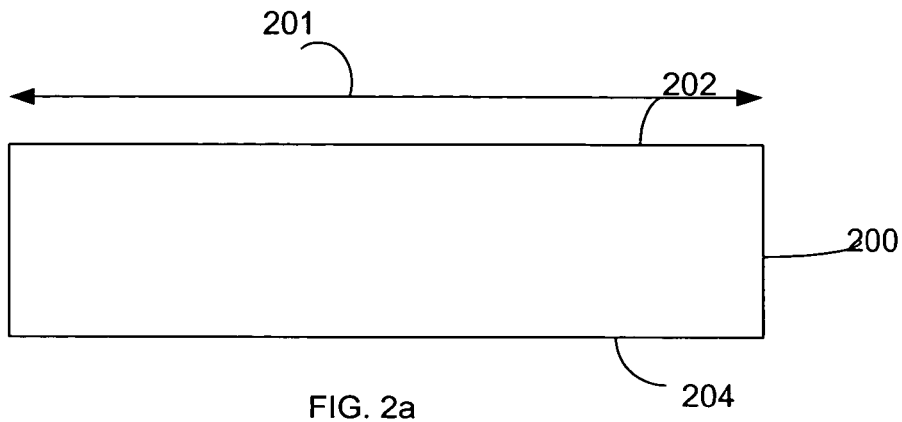
FIGS. 2a-2f represents methods of forming structures according to another embodiment of the present invention.
Figure 2B:
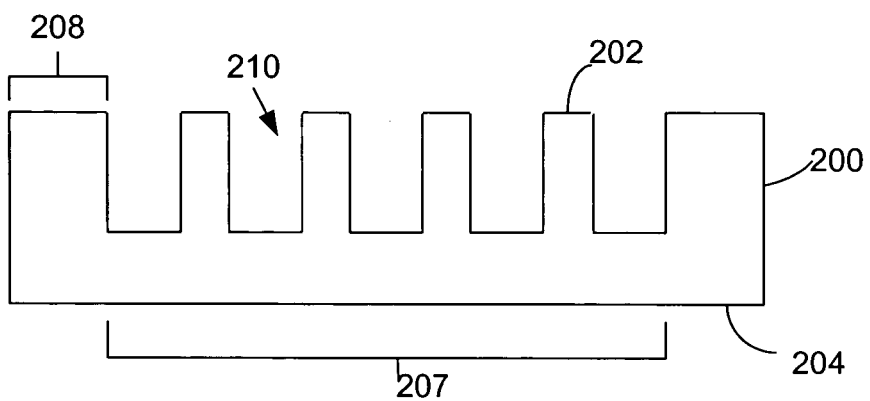

In another embodiment, a substrate 200 (similar to the substrate 100) may be provided (FIG. 2a). In one embodiment, the substrate 200 may comprise a first side 202 and a second side 204. The substrate 200 may comprise a length 201, which in one embodiment may comprise a length, or diameter 201. In one embodiment, the substrate 200 may comprise an inner portion 207 and an outer portion 208 (FIG. 2b). A plurality of openings 210, similar to the plurality of openings 110, may be formed within the first side 202 of the substrate 200 (FIG. 2b).

Figure 2C:
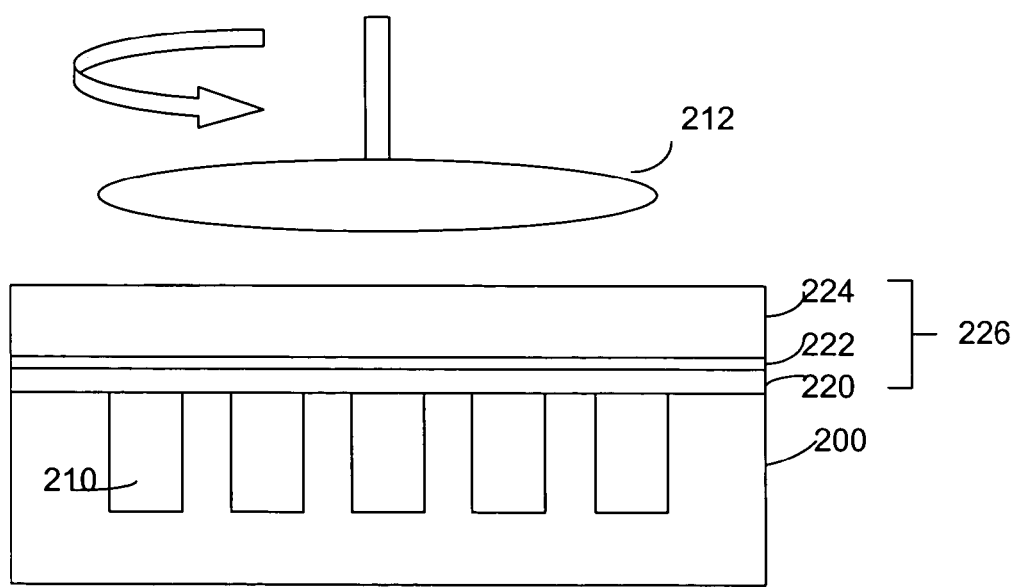

A silicon on insulator wafer 226, similar to the silicon on insulator wafer 126, may comprise a first silicon layer 220 disposed on an insulator layer 222, and the insulator layer 222 may be further disposed on a second silicon layer 224 (FIG. 2c). The first silicon layer 220 may comprise a thickness of under about 1,000 angstroms, and in one embodiment may comprise between about 500 and 1,000 angstroms. The first silicon layer 220 of the silicon on insulator wafer 226 may be bonded to the first side 202 of the substrate 200. In one embodiment, the first silicon layer 220 may be bonded to the first side 202 of the substrate 200 by placing the first silicon layer 220 in direct contact with the first side 202 of the substrate 200 and heating at a temperature above about 600 degrees Celsius, for about 2 hours (FIG. 2c).

Figure 2D:
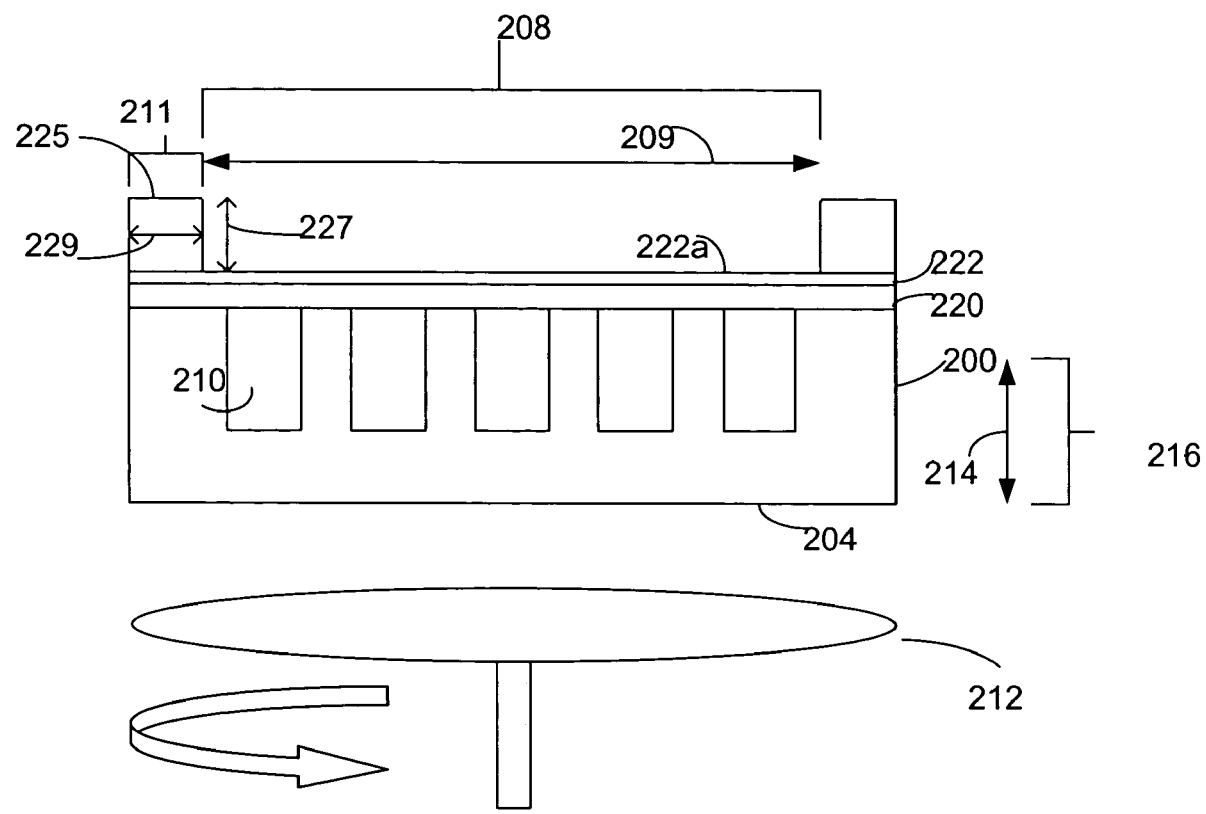

A portion 208 of the second silicon layer 224 may be removed (FIG. 2d). In one embodiment, the portion 208 of the second silicon layer 224 may be removed by a grinding process, such as are well known in the art, by utilizing a grinding tool 212 (FIG. 2c), for example. In one embodiment, a diameter 209 of the portion 208 of the second silicon layer 224 that may be removed may be smaller than the diameter 201 of the substrate 200. In one embodiment, the diameter 209 may comprise from about 5 to about 6 inches. A first thick support structure 225 may be formed by the removal of the portion 208 of the second silicon layer 224. The first thick support structure 225 may provide support for the first silicon layer 220. The first thick support structure 225 may be disposed within the outer portion 208 of the first side 204 of the substrate 200. In one embodiment, the first thick support structure 225 may comprise a height 227 of about 200 to about 400 microns, and a width 229 of about 100 to about 150 microns. A portion 222a of the insulator layer 222 may be exposed by the removal of the second silicon layer 224.

Figure 2E:
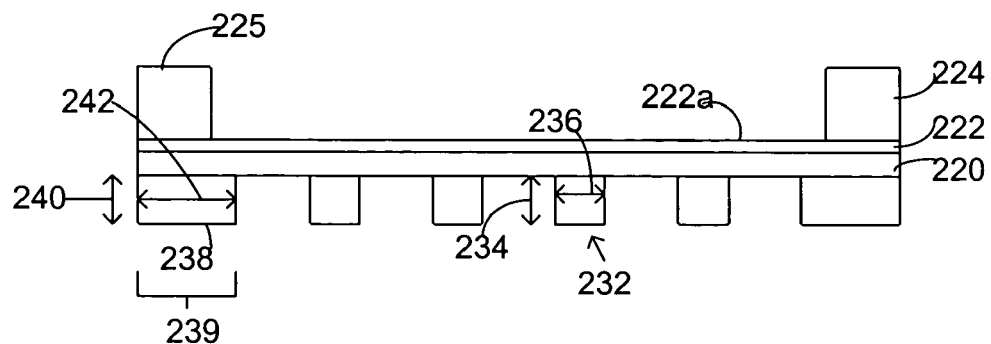

A portion 216 of the second side 204 of the substrate 200 may be removed. The portion may comprise a height 214. In one embodiment, the portion 216 may be removed by a grinding process, such as are well known in the art. In one embodiment, a grinding tool 212 may be utilized, for example. A plurality of support structures 232 may be formed by removing the portion 216 of the second side 204 of the substrate 200 (FIG. 2e). The plurality of support structures 232 may provide support for the first silicon layer 220. The plurality of support structures 232 may comprise a height 234 and a width 236. In one embodiment, the height 234 may comprise from about 8 to about 10 microns. In one embodiment, the width 236 of the plurality of support structures 232 may comprise from about 23 to about 27 microns.

A second thick support structure 238 may be formed by the removal of the portion 216 of the second side 204 of the substrate 200. The second thick support structure 238 may provide support for the first silicon layer 220. The second thick support structure 238 may be disposed within the outer portion 208 of the second side 204 of the substrate 200. In one embodiment, the second thick support structure 238 may comprise a height 240 of about 200 to about 400 microns, and a width 242 of about 30 to about 50 microns. The portion 222a of the insulator layer 222 may then be removed, for example by etching as is known in the art (FIG. 2f), to form a microelectronic structure 244, wherein the microelectronic structure 244 may comprise the first silicon layer 220, the plurality of support structures 232, the first thick support structure 225 and the second thick support structure 238. The microelectronic structure 244 may comprise a reticle protection structure, and in one embodiment may comprise a pellicle capable of protecting a reticle from contamination, such as particulate contamination, as is well known in the art.

Figure 1K:
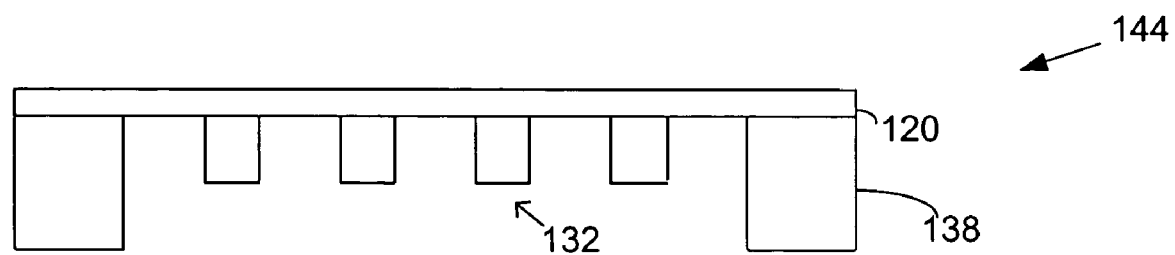
Figure 2F:
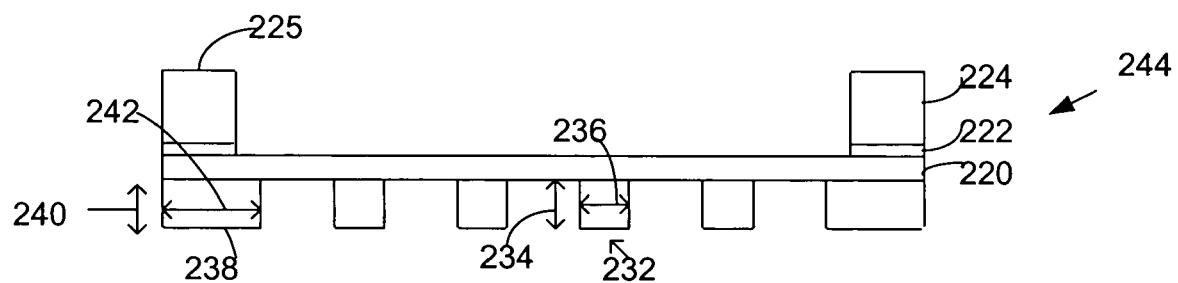
Figure 3A:
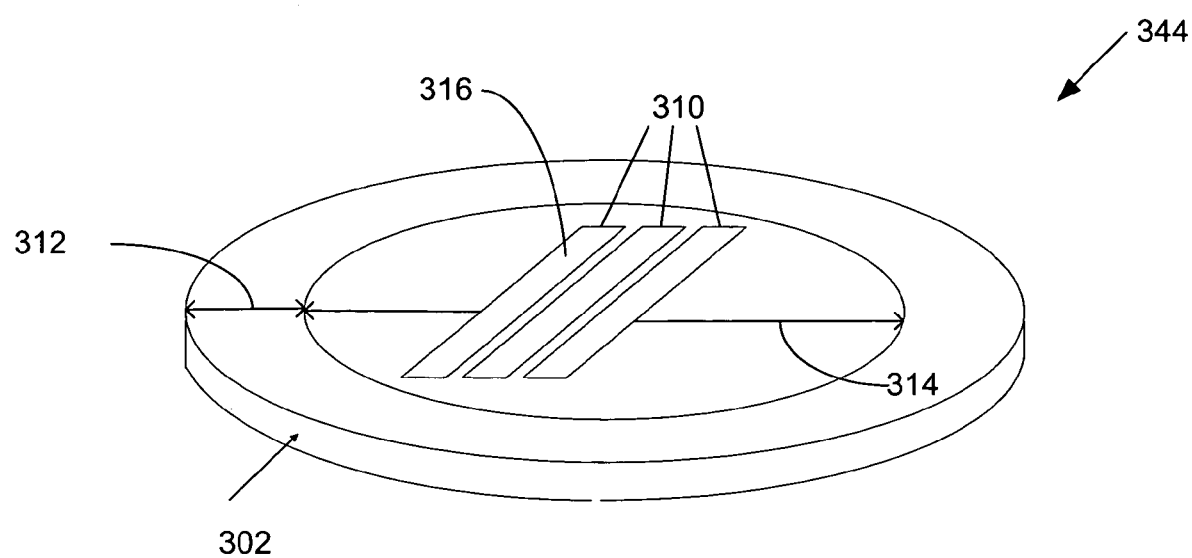
FIG. 3a-3b represents a system according to an embodiment of the present invention.

FIG. 3a depicts a perspective view of a reticle protection structure 344, similar to the reticle protection structures 144 and 244 of FIG. 1k and FIG. 2f respectively. In one embodiment, the reticle protection structure 344 may comprise a pellicle, as is known in the art. The reticle protection structure 344 may comprise a substrate 302, an outer portion 312, which may comprise a thick support structure (not shown), and an inner portion 314. The inner portion 314 may comprise a plurality of openings 310. The plurality of openings 310 may comprise a silicon layer 316 disposed on the plurality of openings 310, wherein in one embodiment, the silicon layer 316 may comprise a thickness below about 1,000 angstroms.

Figure 3B:
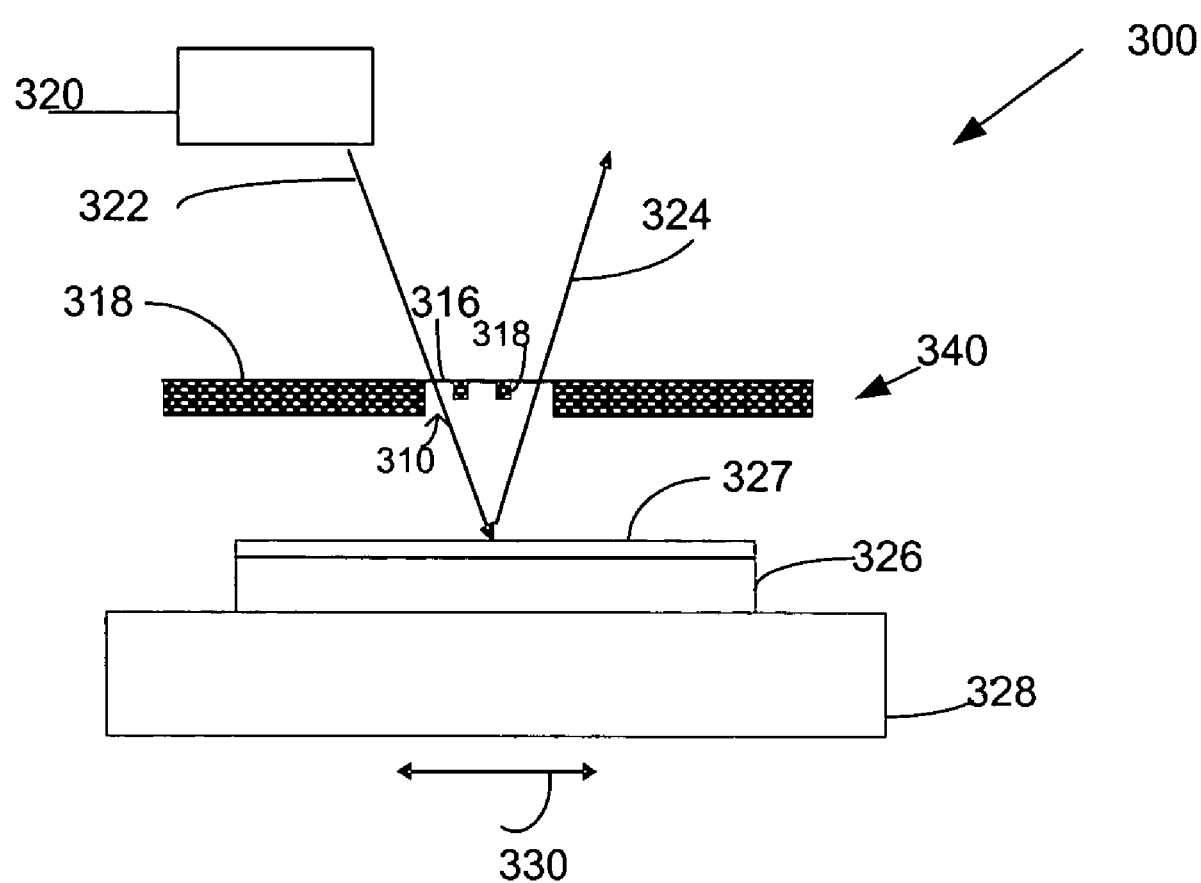

FIG. 3b is a diagram illustrating an exemplary system capable of being operated with methods for fabricating a microelectronic structure, such as the reticle protection structure 344 of FIG. 3a for example. It will be understood that the present embodiment is but one of many possible systems in which the reticle protection structure 344 of the present invention may be used.

In the system 300, a substrate 340, that in one embodiment may comprise a reticle protection structure, such as the reticle protection structure 344 of FIG. 3a, may be provided. The substrate may comprise a plurality of support structures 318. The substrate 344 may comprise a silicon layer 316 that may be disposed on a plurality of openings 310. In one embodiment, the silicon layer 316 may comprise a thickness below about 1,000 angstroms. A radiation source 320 may be provided. The source 320 may comprise a EUV source. The EUV source may comprise any radiation source that may comprise a wavelength below about 15 nm. In one embodiment, the wavelength may comprise between about 12-14 nm, and may comprise a laser-induced and/or electrical discharge gas plasma device, for example.

In one embodiment, radiation 322, which in one embodiment may be EUV radiation, (i.e. comprising a wavelength between about 12 to about 14 nm), may generated from the radiation source 320, and may further be directing through the silicon layer 316 and through one of the plurality of openings 310 of the substrate 340. The radiation 322 may then be reflected off of a second substrate 326 that may comprise a reticle, or mask, as is well known in the art.

The substrate 326 may comprise a EUV mask for example, and may comprise a patterned surface 327. Reflected radiation 324 may then be transmitted through a different one of the plurality of openings 310, and may be transmitted through the silicon layer 316 disposed on the plurality of openings 310. In one embodiment, at least about 60% of the reflected radiation 324 may be transmitted through the silicon layer 316 disposed on the different one of the plurality of openings 310. In one embodiment, the second substrate 326 may be translated, i.e. moved in an x and/or y direction, by a reticle holder 328, to substantially expose the patterned surface 327 to the radiation 322.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as reticle protection structures, are well known in the art. Therefore, the Figures provided herein illustrate only portions of an exemplary microelectronic structure that pertains to the practice of the present invention. Thus the present invention is not limited to the structures described herein.

What is claimed is:

1. A method of forming a structure comprising;
    forming a plurality of openings within a portion of a first side of a substrate;
    bonding a first silicon layer of a silicon on insulator wafer to the first side of the substrate, wherein the silicon on insulator wafer comprises the first silicon layer disposed on an insulator layer disposed on a second silicon layer;
    forming a plurality of support structures by removing a portion of a second side of the substrate;
    removing the second silicon layer; and
    removing the insulator layer.

2. The method of claim 1 wherein forming a plurality of openings within a portion of the first side of the substrate comprises forming the plurality of openings within a portion of the first side of a silicon wafer, wherein the portion comprises a diameter length less than a diameter length of the silicon wafer.

3. The method of claim 1 wherein forming a plurality of openings comprises forming a plurality of openings wherein at least one of the plurality of openings comprises a width of about 30 to about 50 microns.

4. The method of claim 1 wherein bonding the first silicon layer of the silicon on insulator wafer to the first side of the substrate comprises bonding the first silicon layer of the silicon on insulator wafer to the first side of the substrate, wherein the first silicon layer comprises a thickness below about 1,000 angstroms.

5. The method of claim 1 wherein forming a plurality of silicon support structures comprises forming a plurality of support structures wherein at least one of the plurality of silicon support structures comprises a width from about 23 microns to about 27 microns.

6. The method of claim 1 wherein forming a plurality of support structures comprises forming a plurality of support structures wherein at least one of the plurality of support structures comprises a height from about 8 microns to about 10 microns.

7. The method of claim 1 wherein forming a plurality of support structures by removing a portion of the second side of the substrate comprises forming a plurality of support structures by grinding a portion of the second side of the substrate.

8. The method of claim 7 wherein grinding a portion of the second side of the substrate comprises grinding a portion of the second side of the substrate, wherein the portion comprises a diameter less then a diameter of the substrate.

9. The method of claim 1 wherein removing the second silicon layer comprises grinding a first portion of the second silicon layer and then etching the remaining portion of the second silicon layer.

10. The method of claim 1 wherein removing the insulator layer comprises etching the insulator layer.

* * * * *